United States Patent [19]

Hitomi

[11] Patent Number: 4,851,719
[45] Date of Patent: Jul. 25, 1989

[54] TIME CONSTANT AUTOMATIC ADJUSTMENT CIRCUIT FOR A FILTER CIRCUIT

[75] Inventor: Hisakazu Hitomi, Yokohama, Japan

[73] Assignee: Kabushiki Kaisha Toshiba, Kanagawa, Japan

[21] Appl. No.: 237,683

[22] Filed: Aug. 26, 1988

Related U.S. Application Data

[63] Continuation of Ser. No. 78,963, Jul. 29, 1987.

[30] Foreign Application Priority Data

Jul. 30, 1986 [JP] Japan ................................ 61-179102

[51] Int. Cl.⁴ .......................... H03K 5/00; H03B 1/00; H03B 1/10
[52] U.S. Cl. .................................... 307/521; 307/494; 330/51
[58] Field of Search ............... 307/491, 494, 497, 520, 307/521; 328/167; 330/9, 51

[56] References Cited

U.S. PATENT DOCUMENTS 4,691,171 9/1987 Van Roemund et al. ...... 307/520 X

OTHER PUBLICATIONS

Moulding et al., "Gyrator Video Filter IC With Automatic Tuning," IEEE Journal of Solid State Circuits, vol. SC-15, No. 6, pp. 963-967, Dec. 1980.
Japanese Patent Disclosure (Kokai) No. 60-214617 Okada, Oct. 26, 1985.
Japanese Patent Disclosure No. 58-16143, Fukushima et al., Sep. 26, 1983.

*Primary Examiner*—Steven Mottola
*Attorney, Agent, or Firm*—Finnegan, Henderson, Farabow, Garrett, & Dunner

[57] ABSTRACT

An automatic adjustment circuit for adjusting the time constant of a filter circuit, which receives a reference signal having a predetermined voltage and a clock signal. The adjustment circuit includes an integration circuit for generating an integrated signal having a variable voltage level with periodic peak values, which includes a controllable current generating circuit, a capacitor coupled for charging a current from the controllable current generating circuit and a switch for alternately charging and discharging the capacitor in response to the clock signal, a comparator for comparing the peak value with the reference voltage and generating a control signal for adjusting the time constant of the filter circuit and a feedback circuit coupled between the comparator and the controllable current generating circuit for automatically controlling the control signal.

11 Claims, 4 Drawing Sheets

TIME CONSTANT AUTOMATIC ADJUSTMENT CIRCUIT FOR A FILTER CIRCUIT

This application is a continuation, of application Ser. No 078,963, filed July 29, 1987.

BACKGROUND OF THE INVENTION

1. Field of the Invention

The present invention relates to a time constant automatic adjustment circuit and, more particularly, to a time constant automatic adjustment circuit for a filter circuit incorporated into an IC.

2. Description of the Prior Art

In general, a filter circuit employs a time constant circuit for determining the frequency characteristics of the circuit. The time constant circuit requires that the time constant of the circuit be maintained stably at a predetermined value. A time constant circuit is usually constituted by resistive elements and capacitive elements (or equivalent circuits therefor). When such a filter circuit is fabricated as an integrated circuit (referred to as an IC hereafter), it is necessary to adjust the time constant of the time constant circuit externally, since the resistances or the capacitances of the resistive elements and capacitive elements of the circuits are not precise. Further, the resistances or the capacitances of the resistive elements and capacitive elements of the circuits are unstable in relation to temperature change and long term use.

Referring now to FIGS. 1 to 5, some conventional adjustments for some typical filter circuits or time constant circuits will be explained. FIGS. 1 to 5 show five typical examples of a filter circuit, e.g., a low-pass filter.

Figure 1:
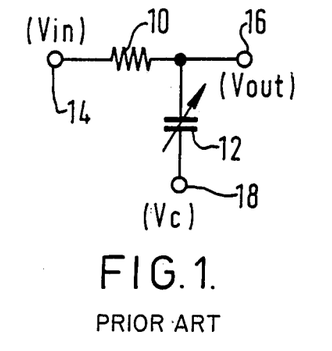
FIGS. 1, 2, 3, 4 and 5 are circuit diagrams to explain the adjustment means of a conventional filter circuit, respectively.

First, the filter circuit shown in FIG. 1 has a time constant circuit comprised of a resistor 10 and a variable capacitor 12. The resistor 10 is connected between an input terminal 14 for receiving an input signal Vin and an output terminal 16 for supplying an output signal Vout. The variable capacitor 12 is connected between the output terminal 16 and a control terminal 18 for receiving a control signal Vc for adjustment. According to the connection of the resistor 10 and the variable capacitor 12, the time constant circuit forms a low-pass filter or an integrating circuit. The capacitance of the variable capacitor 12 varies in response to changes in the value of the control signal Vc on the control terminal 18.

Figure 2:
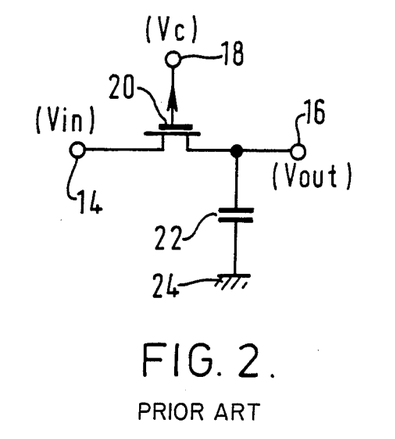

The filter circuit shown in FIG. 2 has a time constant circuit comprised of a field effect transistor (referred to as a FET hereafter) 20 and a capacitor 22. The FET 20 is connected between an input terminal 14 for receiving an input signal Vin and an output terminal 16 for supplying an output signal Vout. The capacitor 22 is connected between the output terminal 6 and a reference potential terminal, e.g., the grounded terminal 24. The FET 20 has a gate connected to a control terminal 18 for receiving a control signal Vc for adjustment. The impedance of the FET 20 varies in response to changes of the value of the control signal Vc on the control terminal Vc.

Figure 3:
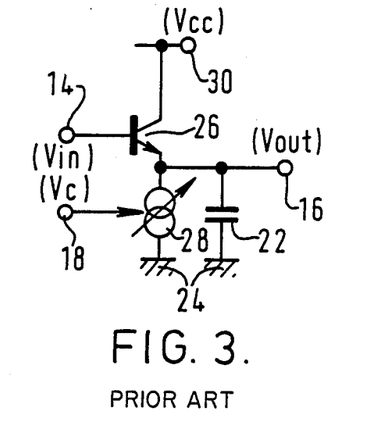

The filter circuit shown in FIG. 3 has a time constant circuit comprised of a bipolar transistor 26, a variable current source 28 and a capacitor 22. The base and the emitter of the bipolar transistor 26 are connected to an input terminal 14 for receiving an input signal Vin and an output terminal 16 for supplying an output signal Vout, respectively. The collector of the bipolar transistor 26 is connected to a power source terminal 30 for receiving a power source voltage Vcc. The variable current source 28 is connected between the emitter of the bipolar transistor 26 and a reference potential terminal, e.g., the grounded terminal 24. The capacitor 22 is connected between the emitter of the bipolar transistor 26 and the grounded terminal 24, i.e., in parallel with the variable current source 28. The variable current source 28 is designed to receive a control signal Vc on a control terminal 18 for adjustment. Thus, the current I28 of the variable current source 28 varies in response to the control signal Vc. The variable current source 28 supplies the bipolar transistor 26 with the variable current I28 in response to the control signal Vc, so that the equivalent emitter resistance of the bipolar transistor 26 is varied. The filter circuits, as shown in FIGS. 1 to 3, have a transfer characteristic G(LPF) as follows:

$$G(LPF) = 1/(1 + j \cdot w \cdot R \cdot C) \tag{1}$$

wherein j is the unit imaginary number ($\sqrt{-1}$) angle frequency of the input signal Vin, R is the resistance or impedance of the resistor 10, the FET 20 or the bipolar transistor 26 and C is the capacitance of the variable capacitor 12 or the capacitors 22. The transfer characteristic G(LPF) is influenced by variations in the amplitude of the input signal Vin. That is, When the amplitude of the input signal Vin varies, the variable capacitor 12 (FIG. 1), the FET 20 (FIG. 2), and the bipolar transistor 26 (FIG. 3) are affected directly by the variation of the input signal Vin. Thus, a distortion is caused in the output signal Vout. As a result, it is difficult for the filter circuits to exhibit their full performance.

Figure 4:
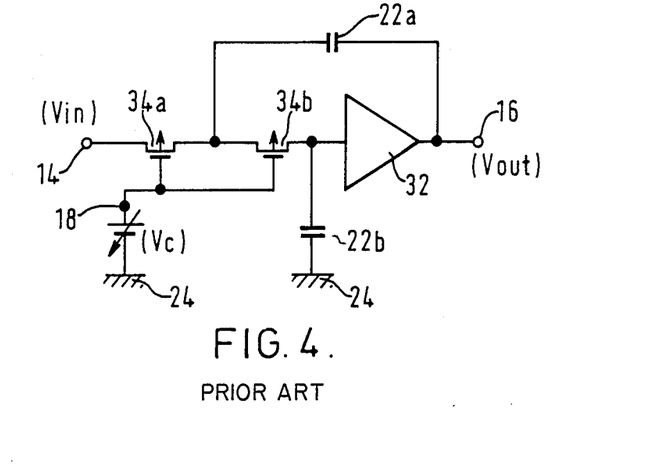

The fourth filter circuit shown in FIG. 4 is comprised of two time constant circuits and a buffer amplifier 32 which are connected in series between an input terminal 14 and an output terminal 16. Each of the two time constant circuits has an MOS FET (metal oxide semiconductor field effect transistor) 34a (34b) and a capacitor 22a (22b). The MOS FETs 34a and 34b of the time constant circuits and the buffer amplifier 32 are connected in series between the input terminal 14 and the output terminal 16. The capacitor 22a of the preceding time constant circuit is connected in parallel with the series circuit of the MOS FET 36b and the buffer amplifier 32. The capacitor 22b of the following time constant circuit is connected between the drain of the second MOS FET 34b and a grounded terminal 24.

An input signal Vin on the input terminal 14 is applied to the buffer amplifier 32 through the two time constant circuits in series, and an output signal Vout appears on the output terminal 16. The MOS FETs 34a and 34b are supplied at their gates with a control signal Vc together through a control terminal 18. Resistances R34a and R34b of the MOS FETs 34a and 34b vary in accordance with the control signal Vc fed to their gates. Thus, the time constants T1 and T2 of the time constant circuits can be varied by the control signal Vc.

The transfer function of the fourth filter circuit shown in FIG. 4 is carried out as follows. If the resistances R34a and R34b of the MOS FETs 34a and 34b satisfy the relations R34a=R34b=R34, and the amplification factor K of the buffer amplifier 32 is 1, $$Vout/Vin = \frac{1/(R34^2 \cdot C22a \cdot C22b)}{S^2 + S/(R34 \cdot C22a) + 1/(R34^2 \cdot C22a \cdot C22b)} \tag{2}$$

wherein S is a constant, i.e., $S=1/(j\cdot w)$.

Hereupon, if the time constants T1 and T2 of the time constant circuits satisfy the relationships:

$$T1=R34\cdot C22a, \quad T2=R34\cdot C22b, \tag{3}$$

The following is obtained:

$$Vout/Vin = \frac{1/(T1\cdot T2)}{S^2 + S/T1 + 1/T1\cdot T2} \tag{4}$$

In case the filter circuit is fabricated in the IC configuration, the absolute values of the capacitances C22a and C22b are largely dispersed to the extent of ±30%), but the relative accuracy is good. For example, if the capacitance C22a is enlarged by +10%, the capacitance C22b is enlarged also by +10%. Therefore, against this dispersion, if the gate voltage of the MOS FETs 34a and 34b, i.e. the control signal Vc is regulated, and the resistance R34 is reduced by 10%, the time constants T1 and T2 can be constantly maintained.

Figure 5:
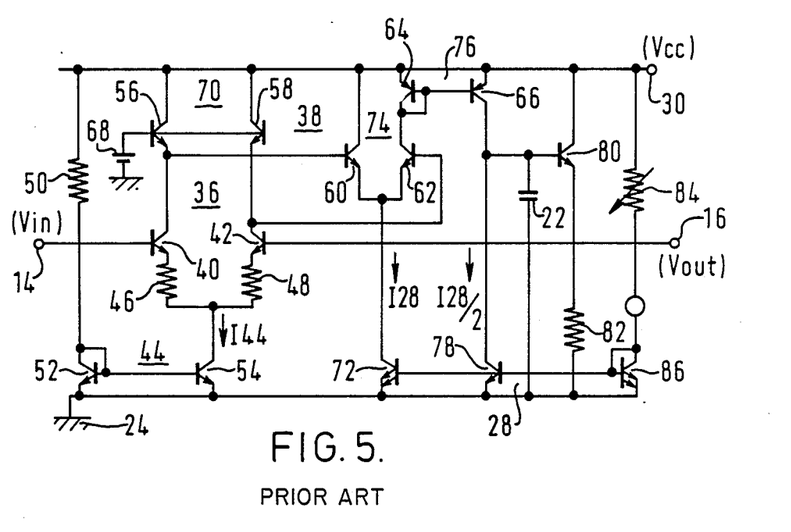

The fifth filter circuit, as shown in FIG. 5, has been devised for reducing the distortion in the output signal Vout. The filter circuit shown in FIG. 5 has a time constant circuit comprised of a first differential amplifier circuit 36 and a capacitor 22. The first differential amplifier circuit 36 and the capacitor 22 are connected to each other through a current conversion circuit 38.

In the first differential amplifier circuit 36, a pair of transistors 40, 42 are connected at their collectors to a power source terminal 30 for receiving a power source voltage Vcc, and at their emitters to a grounded terminal 24 through a fixed current source 44. Resistors 46, 48 are connected between the emitters of the transistors 40, 42 and the fixed current source 44. The fixed current source 44 is comprised of a resistor 50 and a pair of transistors 52 and 54. The resistor 50 and the transistor 52 are connected in series between the power source terminal 30 and the grounded terminal 24. The transistor 52 is connected in a diode fashion, and the transistor 54 is connected at its base to the base of transistor 52. Thus, the transistors 52 and 54 are connected in a current mirror configuration. The transistor 54 is connected between the common connection node of the resistors 46 and 48 of the first differential amplifier circuit 36 and the grounded terminal 24. Thus, the series circuit of the resistor 50 and the transistor 52 provides a fixed current I44. The transistor 54 supplies the same current I44 to the first differential amplifier 36.

The base of the transistor 40 of the first differential amplifier circuit 36 is connected to an input terminal 14 for receiving an input signal Vin, while the base of the transistor 42 is connected to an output terminal 6 for supplying an output signal Vout. The current conversion circuit 38 is comprised of six transistors 56, 58 . . . 66, a reference voltage source 68 with a reference voltage V68 and a variable current source 28.

A pair of the transistors 58, 60 in the current conversion circuit 88 are connected at their collectors to the power source terminal 30 together. Their bases are connected to each other and applied with the reference voltage V68 from the reference voltage source 68. Their emitters are connected to the collectors of the transistors 40 and 42 of the first differential amplifier circuit 36, respectively. The transistors 56, 58 thus constitute an active load circuit 70 for the first differential amplifier circuit 36.

Another pair of the transistors 60, 62 in the current conversion circuit 38 are connected at their collectors to the power source terminal 30. Their emitters are connected to each other and then to the grounded terminal 24 through a transistor 72 of the variable current source 28. Their bases are connected to the collectors of the transistors 40 and 42 of the first differential amplifier circuit 36, respectively. The transistors 60 and 62 thus constitute a second differential amplifier circuit 74.

Another pair of the transistors 64, 66 in the current conversion circuit 38 have a PNP configuration in particular and are connected with each other in a current mirror configuration. That is, their bases are connected to each other and then to the collector of the transistor 64. Their emitters are connected to the power source terminal 30. The collector of the transistor 64 is connected to the transistor 62 of the second differential amplifier circuit 74. The transistors 64 and 66 thus constitute a current mirror configuration active load circuit 76 for the second differential amplifier circuit 74. The output of the second differential amplifier circuit 74 is extracted through the current mirror configuration active load circuit 76. The collector of the transistor 66 of the current mirror configuration active load circuit 76 is connected to the grounded terminal 24 through a transistor 78 of the variable current source 28. The collector of the transistor 66 is further connected to the base of a transistor 80.

The collector of the transistor 80 is connected to the power source terminal 30. The emitter of the transistor 80 is connected to an output terminal 16 of the filter circuit. The output terminal 16 is then connected to the grounded terminal 24 through a resistor 82. Further, the output terminal 16 is connected to the base of the transistor 42 of the first differential amplifier circuit 36. Thus, the output voltage Vout on the output terminal 16 is fed back to the first differential amplifier 36.

The variable current source 28 is comprised of a variable resist 84, a transistor 86 and the transistors 72 and 78. The variable resistor 84 and the transistor 86 are connected in series between the power source terminal 30 and the grounded terminal 24. The transistor 86 is connected itself in a diode fashion, and the transistors 72 and 78 are connected at their bases to the base of transistor 86. Thus, the transistor 86 is connected to the transistors 72 and 78 in current mirror configurations, respectively. Thus, the series circuit of the variable resistor 84 and the transistor 86 provides a variable current I28. The transistor 78 has half the emitter area of the emitter areas of the transistors 72 and 86. Thus, the transistor 72 supplies the second differential amplifier 74 with the same current I28. The transistor 78 supplies the active load circuit 76 with a current half that of the current I28.

The capacitor 22 is connected between the base of the transistor 80 and the grounded terminal 24.

The operation of the fifth filter circuit shown in FIG. 5, will now be described in detail.

When an input signal Vin is applied from the input terminal 14 to the base of the transistor 38 of the first differential amplifier circuit 36, collector currents I40 and I42 flow through the transistors 40, 42 of the first differential amplifier 36, respectively. The currents I40 and I42 also flow through the transistors 56, 58 of the active load circuit 70, respectively. Collector currents I60 and I62 flow through the transistors 60 and 62 of the second differential amplifier circuit 74 of the current conversion circuit 38, respectively. Since the bases of the transistors 56, 68 are connected with each other, the currents I40 and I42 have a relation defined by a logarithmic (Ln) characteristic of PN junctions in the transistors 56 and 58. Since the emitters of the transistors 60, 62 are connected with each other, the currents I60 and I62 have a relation defined by an exponential (Exp) characteristic of PN junctions in the transistors 60 and 62. As is well known, the logarithmic (Ln) characteristic and the exponential (Exp) characteristic compensate for each other. Thus, the following relation is maintained between the collector currents I40, I42, I60 and I62:

$$I40/I42 = I60/I62 \tag{5}$$

Thereupon, the collector currents I40, I42, I60 and I62 are able to be expressed as follows:
I40 = I44/2 + $\Delta i36$
I42 = I44/2 − $\Delta i36$
I60 = I28/2 + $\Delta i74$
I62 = I28/2 − $\Delta i74$ wherein $\Delta i36$ is a variable component of a current flowing through the first differential amplifier 36, and $\Delta i74$ is a variable component of a current flowing through the second differential amplifier 74.

From the above equations, the following equation for the variable component $\Delta i74$ is obtained:

$$\Delta i74 = (I28/I44) \cdot \Delta i36$$

The variable current component $\Delta i74$ flows into the capacitor 22 through the active load 76. Thus, the output signal Vout on the output terminal 16 becomes as follows:

$$\begin{aligned} Vout &= S \cdot \Delta i74/C22 \\ &= (I28/I44) \cdot (S \cdot \Delta i36/C22) \end{aligned} \tag{6}$$

wherein C22 is the capacitance of the capacitor 22.

When this output signal Vout is negatively fed back to the first differential amplifier 36 through the feedback circuit, the variable current component $\Delta i36$ of the first differential amplifier 36 is given as follows;

$$i36 = (Vin - m \cdot Vout)/(R46 + R48) \tag{7}$$

wherein R46, R48 are resistances of the resistors 46, 48, respectively, and m is a signal feedback ratio defined by the resistance of the resistor 82.

From the equations (6) and (7), the following equation is obtained:

$$Vout/Vin = 1/[m + S \cdot C22 \cdot (R46 + R48) \cdot I44/I28] \tag{8}$$

As is made clear from a comparison between the equations (1) and (8), these first to fifth filter circuits shown in FIGS. 1 through 5 have the same frequency characteristic.

The time constant of the fifth filter circuit, as shown in FIG. 5, can be arbitrarily set if the conversion ratio of the current conversion circuit 38 is adjusted through the control of the current I28 of the variable current source 28. The conversion ratio of the current conversion circuit 38 can be adjusted through the control of the current I44 of the variable current source 44, instead of the control of the current I28 of the variable current source 28. That is, the current source of the first differential amplifier 36 is made variable and the current source of the second differential amplifier 74 is made constant.

In the fifth filter circuit, as shown in FIG. 5, the variability of the time constant responds to the variable current source 28 (or the current source 44), but not to the resistors 46, 48 or the capacitor 22. As a result, the variability of the time constant does not respond to amplitude changes of the input signal Vin.

In the conventional filter circuits, as shown in FIGS. 1 to 5, the time constant of the filter characteristics is apt to differ from the designed value due to the inaccuracy of the resistances or the capacitances of the resistive elements and capacitive elements, e.g., the resistors 46, 48 and the capacitor 22. As a result, the time constant must be adjusted by the control of the current I28 and/or I44 of the current sources 28. 44. Further, the time constant is apt to vary due to the unstableness of the resistances or the capacitances of the resistive elements and capacitive elements. Therefore, such an adjustment is required to be made as the occasion may demand. However, when the filter circuit is fabricated in an IC configuration, the need for such an adjustment of the time constant is undesirable. This is because the IC requires an additional pin for receiving the control voltage Vc for this adjustment. In the prior art, there is no suitable means to automatically carry out this adjustment. In the filter circuit, as shown in FIG. 5, a means to correct by utilizing the equivalent resistance obtained by switching the capacitance C22 of the capacitor 22 is present. However, this circuit is unfavorable in terms of noise caused by the switching, and it cannot be used in an analog IC.

SUMMARY OF THE INVENTION

Accordingly, an object of the present invention is to improve the drawbacks of the conventional filter circuits where external adjustment is required.

Another object of the present invention is to provide a time constant automatic adjustment circuit, which can be easily used in an IC.

It is another object of the invention to automatically adjust the time constant of a filter circuit without producing undesirable noise.

In order to achieve the objects, the time constant automatic adjustment circuit of the present invention, which receives a reference signal having a predetermined voltage and a clock signal, comprises an integrating circuit for generating an integrated signal having a variable voltage level with periodic peak values, which includes a controllable current generating circuit, a capacitor coupled for charging a current from the controllable current generating circuit and a switch for alternately charging and discharging the capacitor in response to the clock signal, a comparator for comparing the peak value with the reference voltage and generating a control signal for adjusting the time constant of the filter circuit and a feedback circuit coupled between the comparator and the controllable current generating circuit for automatically controlling the control signal.

DESCRIPTION OF THE PREFERRED EMBODIMENTS

The present invention will now be described in detail with reference to the accompanying drawings, namely, FIGS. 6, 7 and 8. Throughout the drawings, like reference numerals and letters are used to designate elements like or equivalent to those used in FIGS. 1 to 5 (Prior Art Circuits) for the sake of simplicity of explanation.

Figure 6:
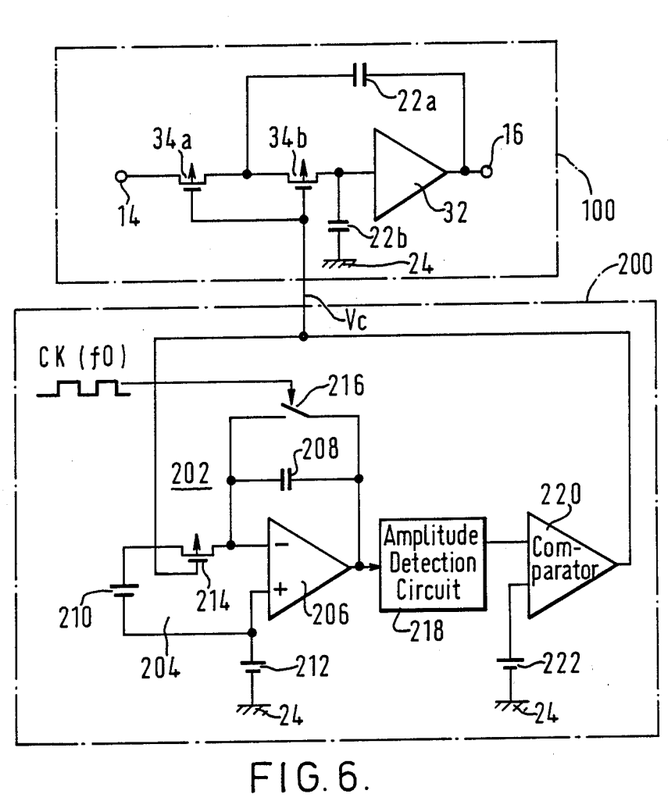
FIG. 6 is a block circuit diagram to show an embodiment of the time constant automatic adjustment circuit of this invention in a filter circuit.

FIG. 6 is a block diagram showing an embodiment of the automatically adjustable filter circuit according to the present invention. As shown in FIG. 6, the embodiment of the automatically adjustable filter circuit is comprised of a filter circuit 100 and a time constant automatic adjusting circuit 200. The constitution of the filter circuit 100 is same as the conventional filter circuit explained in FIG. 4, with the exception of the control signal supply means. Therefore, the same symbols have been applied to the sections corresponding to the circuit in FIG. 4.

The exemplified filter circuit 100 is comprised of two time constant circuits and a buffer amplifier 32 which are connected in series between an input terminal 14 and an output terminal 16. Each of the two time constant circuits has an MOS FET 34a (34b) and a capacitor 22a (22b). The MOS FETs 34a and 34b of the two time constant circuits and the buffer amplifier 32 are connected in series between the input terminal 14 and the output terminal 16. The capacitor 22a of the preceding time constant circuit is connected in parallel with the series circuit of the MOS FET 36b and the buffer amplifier 32. The capacitor 22b of the following time constant circuit is connected between the drain of the second MOS FET 34b and a grounded terminal 24.

An input signal Vin on the input terminal 14 is applied to the buffer amplifier 32 through the two time constant circuits in series, and an output signal Vout appears on the output terminal 16. The MOS FETS 34a and 34b are applied their gates with a control signal Vc from the time constant automatic adjusting circuit 200. Resistances R34a and R34b of the MOS FETs 34a and 34b vary in accordance with the control signal Vc fed to their gates. Thus, the time constants T1 and T2 of the time constant circuits can be varied by the control signal Vc.

The time constant automatic adjusting circuit 200 has an integration circuit 202. This integration circuit 202 is composed of a controllable current generating circuit 204, an operational amplifier 206 and a capacitor 208. The controllable current generating circuit 204 is connected across the inversed phase and non-inversed phase input terminals 206a and 206b of the operational amplifier 206. The capacitor 208 is connected across the inversed phase input terminal 206a and the output terminal 206c of the operational amplifier 206. The controllable current generating circuit 204 is comprised of first and second voltage sources 210 and 212 and an MOS FET 214. The first voltage source 210 is coupled across the inversed phase and the non-inversed phase input terminals 206a and 206b through the MOS FET 214. The second voltage source 212 is coupled between the non-inversed phase input terminals 206b and a grounded terminal 24. A controllable switch 216 is connected in parallel with the capacitor 208. The controllable switch 216 has a control terminal 216a for receiving a clock signal CK with a predetermined frequency f0. Hereupon, the controllable switch 216 is ON/OFF controlled by the clock signal CK with, e.g., a duty of 50%. Thus, a current applied from the controllable current generating circuit 204 is charged into the capacitor 208 during the OFF times of the switch 216. The charge in the capacitor 208 is discharged during the ON times of the switch 216. A voltage signal V208 appearing across the capacitor 208 in accordance with the charge is shown in FIG. 7. As shown in FIG. 7, the voltage signal V208 varies with an intermittent saw teeth waveform. The voltage signal V208 gradually increases in every OFF time of the switch 216. However, the voltage signal V208 is reduced to zero voltage and kept in the voltage in every ON time of the switch 216.

The output terminal 206c of the operational amplifier 206 is connected to an amplitude detection circuit 218 composed of a peak hold circuit. The amplitude detection circuit 218 detects a peak voltage of the output voltage V202 of the integration circuit 202. The peak voltage signal V218 held in the amplitude detection circuit 218 is fed to an input terminal 220a of a comparator 220. Another input terminal 220b of the comparator 220 is applied with a reference voltage V222 from a reference voltage source 222. The comparator 220 compares the peak voltage signal V218 with the reference voltage V222. Then, an error signal V220 between the peak voltage signal V218 and the reference voltage V222 is obtained by the comparator 220 and is fed back to the gate of the MOS FET 214. The error signal V220 is also applied to the filter circuit 100 as the control signal Vc for adjusting the time constant of the filter circuit 100.

Thus, the amplitude detection circuit 216, the comparator 220 and the MOS FET 214 form a control loop so that the input and the output of the integration circuit 202 have a predetermined relation.

The operation of the automatically adjustable filter circuit of FIG. 6 will now be explained. Across the inversed input 206a and non-inversed input 206b of the operational amplifier 206, a specified voltage V210 of the first voltage source 210 is applied with reversed polarity. Therefore, a current I214 flows through the MOS FET 214. This current I214 is expressed by the following:

$$I214 = V210/R214 \quad (9)$$

wherein R214 is the resistance of the MOS FET 214.

When the switch 216 is Off, the potential of the output 206c of the operational amplifier 206 rises toward the voltage V212 of the second voltage source 212. In case the switch 216 is ON, since the current I214 flows in the inversed phase input 206a of the operational amplifier 206, the potential of the output 206c reduces. The switch 216 is controlled by the clock signal with the frequency f0, and if the duty of this clock signal is 50%, a time t0 when the switch 216 is turned ON/OFF is as follows:

$$t0 = (\tfrac{1}{2}) \cdot f0 \quad (10)$$

After the switch 216 is turned OFF and the voltage applied to the capacitor 208 is V208, the following is obtained:

$$V208 = (I210 \cdot t0)/C208 \quad (11)$$

wherein C208 is the capacitance of the capacitor 208. Now, when V208=V222 the circuit is in a control target value state and stabilized, and the resistance R214 of the MOS FET 214 satisfies the following relation from equations (9), (10) and (11):

$$R214 = [V210/(2 \cdot f0 \cdot V222)] \cdot (1/C208) \quad (12)$$

The resistance R214 is determined by the output error voltage V220 of the comparator 220, i.e., the control signal Vc. This control signal Vc is simultaneously fed as a gate voltage of the MOS FETs 34a and 34b of the filter circuit 100, and determines the resistances R34a and R34b of these MOS FETs 34a and 34b. This means that time constants T1 and T2 of time constant circuits in the filter circuit 100 have been set.

The time constants T1 and T2 of the time constant circuits in the filter circuit 100 are expressed as follows by equations (2) and (12):

$$T1 = R34 \cdot C22a = (1/2f0)(V210/V222) \cdot (C22a/C208) \quad (13)$$

$$T2 = R34 \cdot C22b = (1/2f0) \cdot (V210/V222) \cdot (C22b/C208) \quad (14)$$

Hereupon, the capacitors 22a, 22b and 208 can be made on the same IC chip with almost identical accuracy so that they have a very good relative accuracy among them. As a result, the capacitance ratios C22a/C208 and C22b/C208 are made constant, if the capacitances C22a, C22b and C208 would vary. Further, since the voltages V210 and V222 are constant, the following relations are obtained:

$$T1 = t0 \cdot K1 = (\tfrac{1}{2}) \cdot f0 \cdot K1 \quad (15)$$

$$T2 = t0 \cdot K2 = (\tfrac{1}{2}) \cdot f0 \cdot K2 \quad (16)$$

wherein K; and K2 are constant parts of equations (13) and (14), i.e., $K1 = (V210/V222) \cdot (C22a/C208)$, $K2 = (V210/V222) \cdot (C22b/C208)$, respectively.

As a result, even in case the capacitances of the capacitors are dispersed, the resistances of the MOS FETs are controlled in accordance with the control signal Vc so that the time constant of the filter circuit 100 can automatically be corrected in a predetermined value. Moreover, the time constant of the filter circuit 100 is the function of the clock frequency f0, as seen from the equations (15), (16). Accordingly, the time constant is maintained with relatively high grade accuracy, in a provision that the clock frequency f0 is very stable. In this respect, recent digital circuit technology has been developed to provide the clock signal with enough stability of frequency. In such a way, this circuit can automatically maintain the desired filter characteristic, irrespective of the dispersion of capacitances of capacitors comprising time constant circuits. Therefore, there is no need to install an external resistor for adjusting the time constant. This also results in a reduction of the number of pins required for the external time constant adjusting resistor from conventional IC chips. Further, in case it is desired to change the filter characteristic of filter circuits, the change of the filter characteristic can easily be done by changing the clock frequency. Thus, the scope of application can be enlarged.

In the embodiment of FIG. 6, the time constant of the filter circuit 100 is adjusted through the control of the resistances R34a, R34b of the MOS FETs 34a, 34b. However, the adjustment of the time constant is done by changing the capacitors 22a, 22b with variable capacitors and controlling the capacitances of the variable capacitors. In this case, for example, a diode may be used as the variable capacitor. The filter characteristics, i.e., the time constant of the filter circuit may be adjusted by controlling its terminal voltage.

Figure 8:
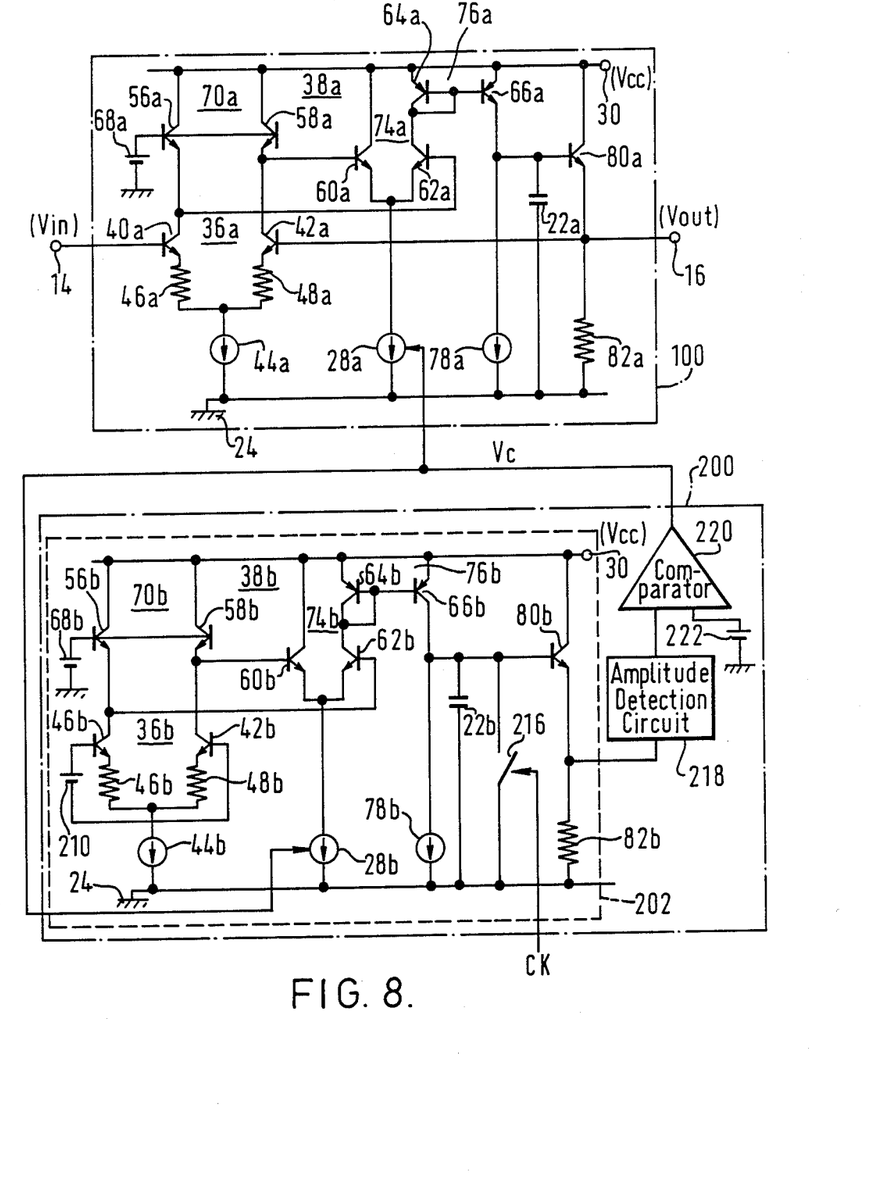
FIG. 8 is a block circuit diagram showing another embodiment of the time constant automatic adjustment circuit of this invention in a filter circuit.

FIG. 8 is a block diagram showing another embodiment of the automatically adjustable filter circuit according to the present invention. As shown in FIG. 8, the embodiment of the automatically adjustable filter circuit also is comprised of a filter circuit 100 and a time constant automatic adjusting circuit 200. The constitution of the filter circuit 100 is almost same as the conventional filter circuit explained in connection with FIG. 5, with the exception of the control signal supply means. In FIG. 8, circuits corresponding to the current sources 44 and 28 of FIG. 5 are represented by a conventional symbol, as shown in the drawing. Further, a part of the time constant automatic adjusting circuit 200 is constituted by a circuit corresponding to the filter circuit 100. Therefore, the same symbols have been applied to the sections corresponding to the circuit in FIG. 5. However, some letters will be affixed to the reference numerals for necessary differentiation.

The exemplified filter circuit 100 has a time constant circuit comprised of a first differential amplifier circuit 36a and a capacitor 22a. The first differential amplifier circuit 36a and the capacitor 22a are connected to each other through a current conversion circuit 38a.

In the first differential amplifier circuit 36a, a pair of transistors 40a, 42a are connected at their collectors to a power source terminal 30 for receiving a power source voltage Vcc, and at their emitters to a grounded terminal 24 through a fixed current source 44a. Resistors 46a, 48a are connected between the emitters of the transistors 40a, 42a and the fixed current source 44a.

The base of the transistor 40a of the first differential amplifier circuit 36a is connected to an input terminal 14 for receiving an input signal Vin, while the base of the transistor 42a is connected to an output terminal 16 for supplying an output signal Vout. The current conversion circuit 38a is comprised of six transistors 56a, 58a ... 66a, a reference voltage source 68a with a reference voltage V68a pk and a variable current source 28a.

A pair of the transistors 58a, 60a in the current conversion circuit 38a are connected at their collectors to the power source terminal 30. Their bases are connected to each other and applied with the reference voltage V68a from the reference voltage source 68a. Their emitters are connected to the collectors of the transistors 40a and 42a of the first differential amplifier circuit 36a, respectively. The transistors 56a, 58a thus constitute an active load circuit 70a for the first differential amplifier circuit 36a.

Another pair of the transistors 60a, 62a in the current conversion circuit 38a are connected at their collectors to the power source terminal 30. Their emitters are connected to each other and then to the grounded terminal 24 through a variable current source 28a. Their bases are connected to the collectors of the transistors 40a and 42a of the first differential amplifier circuit 36a, respectively. The transistors 60a and 62a thus constitute a second differential amplifier circuit 74a.

Another pair of the transistors 64a, 66a in the current conversion circuit 38a have a PNP configuration in particular and are connected with each other in current mirror configuration. That is, their bases are connected to each other and then to the collector of the transistor 64a. Their emitters are connected to the power source terminal 30. The collector of the transistor 64a is connected to the transistor 62a of the second differential amplifier circuit 74a. The transistors 64a and 66a thus constitute a current mirror configuration active load circuit 76a for the second differential amplifier circuit 74a. The output of the second differential amplifier circuit 74a is extracted through the current mirror configuration active load circuit 76a. The collector of the transistor 66a of the current mirror configuration active load circuit 76a is connected to the grounded terminal 24 through a current source 78a. The collector of the transistor 66a is further connected to the base of a transistor 80a.

The collector of the transistor 80a is connected to the power source terminal 30. The emitter of the transistor 80a is connected to an output terminal 16 of the filter circuit 100. The output terminal 16 is then connected to the grounded terminal 24 through a resistor 82a. Further, the output terminal 16 is connected to the base of the transistor 42a of the first differential amplifier circuit 36a. Thus, the output voltage Vout on the output terminal 16 is fed back to the first differential amplifier 36a.

The capacitor 22a is connected between the base of the transistor 80a and the grounded terminal 24.

The time constant automatic adjusting circuit 200 has an integration circuit 202, a controllable switch 216 a amplitude detection circuit 218 and a comparator 220. The integration circuit 202 is comprised of a circuit almost equivalent to the filter circuit 100, with the exceptions of the first differential amplifier circuit 36b. Therefore, the same or equivalent elements and portions as the filter circuit 100 are shown with same reference numerals but differentiated by the letter b affixed thereto, and explanations therefor will be omitted.

The time constant automatic adjusting circuit 200 feeds the control signal Vc to the filter circuit 100 for time constant adjustment. In this time constant automatic adjusting circuit 200, a voltage source 210 with a specified voltage V210 is connected between the bases of the transistors 40b and 42b of the first differential amplifier 36b. The controllable switch 216 is connected in parallel with the capacitor 22b which corresponds to the capacitor 208 of FIG. 6. The controllable switch 216 has a control terminal 216a for receiving a clock signal CK with a predetermined frequency f0. Hereupon, the controllable switch 216 is ON/OFF controlled by the clock signal CK with, e.g., a duty of 50%. Thus, a current applied from the integration circuit 202 is charged into the capacitor 22b during the OFF times of the switch 216. The charges in the capacitor 22b is discharged during the ON times of the switch 216.

Figure 7:
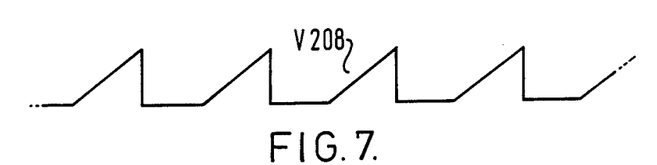
FIG. 7 is a graph showing a waveform of the integration signal in the integration circuit of FIG. 6.

A voltage signal V22b appearing across the capacitor 22b in accordance with the charge also varies accordingly to the waveform shown in FIG. 7. The saw teeth waveform signal V22b is introduced to an output terminal 16b of the integration circuit 202 through a transistor 80b. Here, the output V22b of the integration circuit 202 is not fed back to the first differential amplifier 36b, as in to the filter circuit 100. The amplitude detection circuit 218 and the comparator 220 process the voltage signal V22b on the output terminal 16b in the same manner as the embodiment of FIG. 6. Thus, an error signal V220 between a signal corresponding to a peak value of the voltage signal V22b and a reference voltage V222 applied from a reference voltage source 222 is obtained as a control signal Vc.

The error signal V220, i.e., the control signal Vc obtained by the comparator 220 is fed back to a control terminal of the variable current source 28b. The variable current source 28b varies the current conversion characteristics of the current conversion circuit 38b so that the integration operation of the capacitor 22b is automatically controlled to a suitable state. Thus, the amplitude detection circuit 216, the comparator 220 and the integration circuit 202 form a control loop so that the input Vin-b and the output Vout-b of the integration circuit 202 have a predetermined relation, as described before in reference to the embodiment of FIG. 6.

The control signal Vc is also applied to the filter circuit 100 for adjusting the time constant of the filter circuit 100. Thus, the same result as the embodiment of FIG. 6 is obtained, with the automatic adjustment of the time constant of the filter circuit 100.

As described above, the present invention can provide a very useful time constant automatic adjustment circuit. Further, a time constant of a filter circuit can be determined only by the frequency of the clock signal. Therefore, in a filter circuit made in an IC configuration, the time constant of the filter circuit is easily determined by the frequency of the clock signal, and the filter characteristics of the filter circuit are automatically stablized without any external adjustment. The accuracies of the time constant and the automatic adjustment of the filter characteristics become precise to a very high grade, since the recent digital circuit technology has been developed to provide the clock signal with enough stability of frequency.

Thus, there is no need to carry out the time constant adjustment by external parts. Further, even if there is dispersion in the absolute values of the circuit elements, the automatic time constant adjustment can be obtained.

The present invention is not limited to these embodiments. For example, even if the filter circuits shown in FIGS. 1, 2 and 3 are employed as the filter circuit 100, similar results can be obtained. In addition, the present invention may be modified in various other ways without departing from the scope or spirit of the invention.

As described above, the present invention can provide an extremely preferable time constant automatic adjustment circuit.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. An automatic adjustment circuit for adjusting the time constant of a filter circuit, the adjustment circuit receiving a reference signal having a predetermined reference voltage, and a clock signal, comprising:

integration circuit means for generating an integrated signal having a variable voltage level with periodic peak values, including controllable current generating circuit means, capacitor means for charging a current from the controllable current generating circuit means and switch means for alternately charging and discharging the capacitor means in response to the clock signal;

means for comparing the peak values with the reference voltage and generating a control signal for adjusting the time constant of the filter circuit; and feedback circuit means coupled between the comparing means and the controllable current generating circuit means for automatically controlling the control signal.

2. The automatic time constant adjustment circuit of claim 1 wherein the adjustment circuit also includes amplitude detection means coupled to the capacitor means for detecting the peak voltage of the integrated signal.

3. The automatic time constant adjustment circuit of claim 2 wherein the adjustment circuit and the filter circuit are in the same integrated circuit chip.

4. The automatic time constant adjustment circuit of claim 3 wherein the filter circuit includes time constant varying means and the controllable current generating circuit means also includes means corresponding to the time constant varying means of the filter circuit.

5. The automatic time constant adjustment circuit of claim 4 wherein the each of the time constant varying means is connected to the comparing means for receiving the control signal.

6. The automatic time constant adjustment circuit of claim 5 wherein the time constant varying means are variable resistance means and the controllable current generating circuit means includes a fixed voltage source and a variable resistance means is connected between the fixed voltage source and the capacitor means.

7. The automatic time constant adjustment circuit of claim 6 wherein the variable resistance means are MOS transistors.

8. The automatic time constant adjustment circuit of claim 7 wherein the integration circuit means also includes an operational amplifier in parallel with the capacitor means.

9. The automatic time constant adjustment circuit of claim 5 wherein the time constant varying means are current conversion circuit means and the controllable current generating circuit means includes a fixed voltage source and a current conversion circuit means is connected between the fixed voltage source and the capacitor means.

10. An automatic adjustment circuit for adjusting the time constant of a filter circuit, said adjustment circuit receiving a reference signal having a predetermined reference voltage and a clock signal, said automatic adjustment circuit comprising:

integration circuit means for generating an integrated signal having a variable voltage level with periodic peak values, said integration circuit means comprising controllable current generating circuit means including a fixed voltage source, capacitor means for charging a current from said controllable current generating circuit means, and switch means for alternately charging and discharging said capacitor means in response to said clock signal;

means for comprising said peak values with said reference voltage and generating a control signal for adjusting the time constant of said filter circuit;

feedback circuit means coupled between said comparing means and said controllable current circuit generating means for automatically controlling said control signal; and amplitude detection means coupled to said capacitor means for detecting the peak voltage of said integrated signal;

wherein said automatic adjustment circuit and said filter circuit are in the same integrated circuit chip;

wherein said filter circuit includes time constant varying means and said controller current generating means further comprises means corresponding to said time constant varying means, said time constant varying means comprising current conversion circuit means connected between said fixed voltage source and said capacitor means, current conversion circuit means comprising first and second differential amplifier means connected in series with one another, and first and second current source means for supplying current to said first and second differential amplifier means; and each of said time constant varying means is connected to said comparing means for receiving said control signal.

11. The automatic time constant adjustment circuit of claim 10 wherein each one of the first and second current source means is connected to the comparing means for receiving the control signal.

* * * * *